United States Patent
Da Dalt et al.

(10) Patent No.: US 8,076,978 B2
(45) Date of Patent: Dec. 13, 2011

(54) CIRCUIT WITH NOISE SHAPER

(75) Inventors: Nicola Da Dalt, Villach (AT); Edwin Thaller, Faak am See (AT)

(73) Assignee: Infineon Technologies AG, Neubiberg (DE)

( * ) Notice: Subject to any disclaimer, the term of this patent is extended or adjusted under 35 U.S.C. 154(b) by 262 days.

(21) Appl. No.: 12/270,584

(22) Filed: Nov. 13, 2008

(65) Prior Publication Data
US 2010/0117743 A1    May 13, 2010

(51) Int. Cl.
*H03L 7/085* (2006.01)
*H03L 7/089* (2006.01)

(52) U.S. Cl. ............ 331/1 A; 331/1 R; 331/16; 331/17; 331/18; 331/25; 331/34; 331/117 R

(58) Field of Classification Search ................... 331/1 A, 331/1 R, 16, 17, 18, 25, 34, 117 R
See application file for complete search history.

(56) References Cited

U.S. PATENT DOCUMENTS

| | | | |
|---|---|---|---|
| 5,724,285 A | | 3/1998 | Shinohara |
| 5,825,253 A | * | 10/1998 | Mathe et al. ............. 331/18 |
| 6,369,661 B1 | * | 4/2002 | Scott et al. .............. 331/45 |
| 6,515,553 B1 | * | 2/2003 | Filiol et al. ............. 332/127 |
| 2002/0089356 A1 | | 7/2002 | Perrott et al. |
| 2003/0198311 A1 | * | 10/2003 | Song et al. ............. 375/376 |
| 2004/0212410 A1 | * | 10/2004 | Ghazali et al. ............. 327/156 |
| 2007/0025490 A1 | | 2/2007 | Azadet et al. |
| 2007/0030939 A1 | | 2/2007 | Gazsi |
| 2007/0164828 A1 | * | 7/2007 | Uozumi et al. ............. 331/16 |
| 2007/0285178 A1 | | 12/2007 | Werker |
| 2008/0012647 A1 | | 1/2008 | Risbo et al. |
| 2008/0068236 A1 | | 3/2008 | Sheba et al. |
| 2008/0084250 A1 | | 4/2008 | Ishikawa et al. |
| 2009/0302951 A1 | * | 12/2009 | Ballantyne ............. 331/16 |
| 2010/0097150 A1 | * | 4/2010 | Ueda et al. ............. 331/25 |

OTHER PUBLICATIONS

ISSCC 2004, Session 15, Wireless Consumer ICs, 15.3.

* cited by examiner

*Primary Examiner* — Joseph Chang
*Assistant Examiner* — Richard Tan
(74) *Attorney, Agent, or Firm* — Lee & Hayes, PLLC

(57) ABSTRACT

In an embodiment, a circuit comprising an oscillator is provided. The oscillator is controlled based on a feedback value and an input reference value. The feedback value or the reference value or both are generated using noise shaping.

15 Claims, 4 Drawing Sheets

CIRCUIT WITH NOISE SHAPER

BACKGROUND OF THE INVENTION

In many different kinds of electronic devices, for example in communication devices, phase-locked loops (PLLs) are used for frequency synthesis. In general, with phase-locked loops output signals may be generated which have a predetermined frequency and phase relationship with a reference signal, for example a reference clock signal.

Controlling such phase-locked loops conventionally involves the determination of a phase and/or frequency relationship between the output signal of the phase-locked loop and the reference signals. In some application, for example in digital phase-locked loops, a low resolution of such a phase difference detection may cause unwanted effects like jitter comprising low frequency components.

SUMMARY

In an embodiment, a circuit is provided. The circuit according to this embodiment comprises an oscillator configured to output an output signal having a frequency, a feedback value generator configured to generate a feedback value depending on said output signal, and a reference value generator configured to generate a reference value depending on a predetermined value. Furthermore, the circuit comprises a loop filter configured to control the oscillator based on the feedback value and the reference value.

In an embodiment, the feedback value generator comprises a noise shaper circuit. In another embodiment, the reference value generator comprises a noise shaper circuit. These embodiments may also be combined with each other.

In other embodiments, other elements, signals or values may be used.

DETAILED DESCRIPTION OF THE INVENTION

Figure 1:
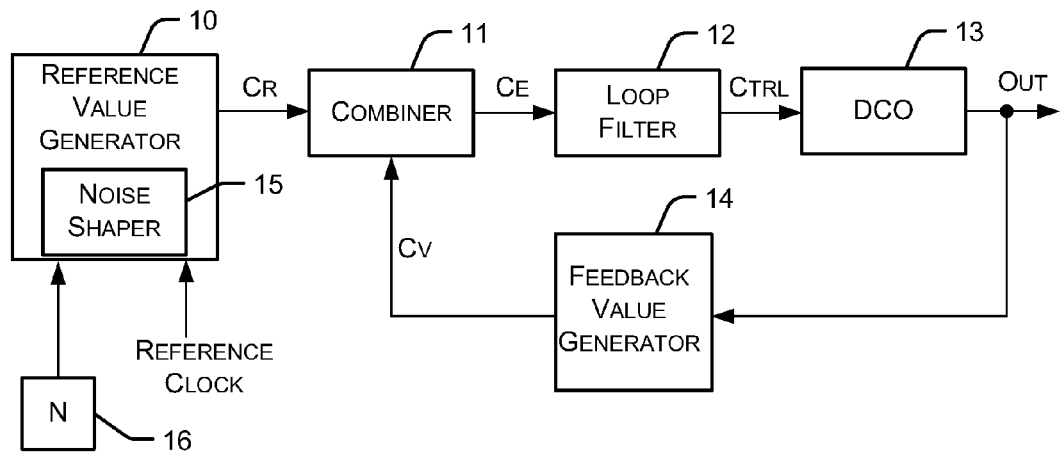
FIG. 1 shows a block diagram of a phase-locked loop according to an embodiment of the present invention.

In the following, embodiments of the present invention will be described in detail with reference to the attached drawings. It is to be noted that the embodiments described hereinafter are merely intended to illustrate the present invention and are not to be construed as limiting the scope thereof. It is to be understood that in the following description of embodiments, any direct connection or coupling between functional blocks, device, components, circuit elements or other physical or functional units shown in the drawings or described herein, i.e. any connection without intervening elements, could also be implemented by an indirect connection or coupling, i.e. a connection or coupling with one or more additional intervening elements. Furthermore, it should be appreciated that the partitioning of embodiments into functional blocks or units shown in the drawings is not to be construed as indicating that these units necessarily are implemented physically separate. Generally, functional blocks or units may be implemented as separate circuits, chips or elements, but two or more functional blocks or units may also be implemented in a common circuit or common chip.

It is to be understood that features of various embodiments described hereinafter may be combined with each other unless specifically noted otherwise.

Furthermore, it is to be understood that describing an embodiment comprising a plurality of elements is not to be construed as indicating that all these elements are necessary for practicing the present invention. Instead, in other embodiments, only some of such elements and/or alternative elements may be present.

It is to be noted that any directional terminology like "top", "bottom", "left" or "right" used in the following detailed description is merely used for easy reference to certain portions of the drawings and is not to be construed as limiting the actual positioning of elements of embodiments in implementations thereof.

In the figures, like reference numerals indicate similar or equivalent, but not necessarily identical elements.

In the following, phase-locked loops (PLLs) according to embodiments of the present invention will be described.

A phase-locked loop according to some embodiments may comprise a digitally controlled oscillator (DCO). Generally, a digitally controlled oscillator is an oscillator the output frequency or output frequencies of which may be controlled using a digital control signal.

In phase-locked loops, generally a phase of an output signal or of a plurality of output signals of an oscillator is in some manner aligned to, i.e. adjusted to have a predetermined relationship with, a phase of a reference clock.

Turning now to FIG. 1, a phase-locked loop according to an embodiment of the present invention is shown. In the embodiment of FIG. 1, a digitally controlled oscillator (DCO) 13 is configured to output an output signal out having a frequency determined by a digital control signal ctrl fed to DCO 13. It should be noted that while a single output signal out is shown, DCO 13 in another embodiment may also output a plurality of output signals.

Output signal out may for example be a digital clock signal having an essentially rectangular waveform with falling and rising edges.

In the embodiment of FIG. 1, output signal out is fed to a feedback value generator 14 which is configured to generate a feedback value Cv based on output signal out. Feedback value generator 14 may for example count the rising edges and/or falling edges of output signal out, i.e. comprise a counter, and output a corresponding counted value as value Cv or may comprise any other type of phase quantizer which obtains some indication of the phase and/or frequency of the output signal out.

The feedback value Cv in the embodiment of FIG. 1 is fed to a combiner 11.

Additionally, a reference value Cr generated by a reference value generator 10 is fed to combiner 11. In the embodiment of FIG. 1, reference value generator 10 generates reference value Cr based on a predetermined value N stored in a storage like a memory 16 and a reference clock. In an embodiment, the value N describes an intended relationship between a frequency of the output signal out and a frequency of the reference clock. N may be an integer value, but may also be a non-integer value.

For generating reference value Cr, in an embodiment reference value generator 10 may comprise one or more counters which at least on average serve to increase the reference Cr by N every clock cycle of the reference clock. In another embodiment, reference value generator 10 may be configured to output a reference value Cr which on average is equal to N.

In the embodiment of FIG. 1, reference value generator 10 comprises a noise shaper circuit 15 which performs a noise shaping for generating the reference value Cr or a part thereof. Noise shaping generally relates to a technique for moving or smearing out noise like quantization noise. For example, a signal value may be modulated depending on an quantization error of a preceding signal value. In the present case, for example instead of simply increasing Cr with every clock period of the reference clock by N or by simply feeding N as value Cr, Cr is modulated such that it only on average corresponds to the value without noise shaping, but itself exhibits variations. In an embodiment, only a non-integer part of N, i.e. a fractional part, may be subjected to such noise shaping.

Combiner 11 is configured to combine reference value Cr and feedback value Cv, for example by subtracting one from the other, and output an error value Ce corresponding to this combination. Error value Ce is fed to a loop filter 11 to generate the control signal ctrl.

It should be noted that in the embodiment of FIG. 1, reference value generator 10 generates reference value Cr independent of any signal values in a path from combiner 11 to DCO 13 via loop filter 12, e.g. independent of Ce and ctrl, and independent of any signal values in a path from DCO 13 via feedback value generator 14 to combiner 11, e.g. independent of out and Cv.

Figure 2:
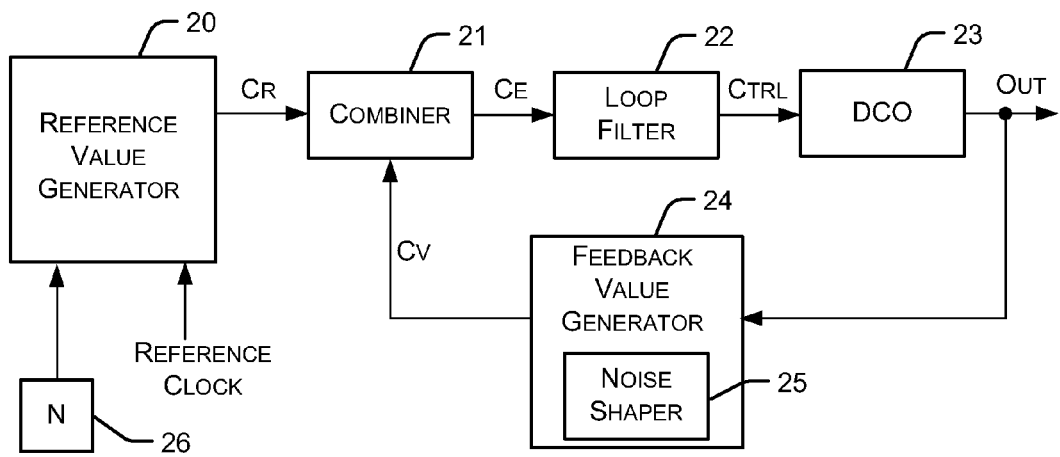
FIG. 2 shows a block diagram of a phase-locked loop according to another embodiment of the present invention.

Turning now to FIG. 2, in FIG. 2 a block diagram of a phase-locked loop according to another embodiment of the present invention is shown. A combiner 21, a loop filter 22, a storage 26 and a digitally controlled oscillator 23 of the embodiment of FIG. 2 correspond to combiner 11, loop filter 12, storage 16 and DCO 13 of the embodiment of FIG. 1 and will therefore not be described again. Furthermore, the general purpose and functioning of feedback value generator 24 of the embodiment of FIG. 2 corresponds to feedback value generator 14 of the embodiment of FIG. 1, and the general purpose and operation of a reference value generator 20 of the embodiment of FIG. 2 corresponds to the one already described for reference value generator 10 of FIG. 1, with the difference that in the embodiment of FIG. 2, no noise shaper circuit is provided in reference value generator 20, but a noise shaper circuit 25 is provided in feedback value generator 24. In other words, in the embodiment of FIG. 2, the feedback value Cv is a noise shaped signal. Otherwise, the operation of the embodiment of FIG. 2 corresponds to the operation of the embodiment of FIG. 1.

In this respect, it should be noted that in the embodiments of FIGS. 1 and 2, reference value Cr and feedback value Cv need not be single values or single signals, but also may comprise two or more values or signals generated by different portions of reference value generator 10 and feedback value generator 14, respectively.

In other embodiments, a noise shaper circuit may be provided both in a reference value generator and in a feedback value generator.

In the following, further embodiments will be described which comprise non-limiting examples for the implementation of a reference value generator comprising a noise shaper circuit or a feedback value generator comprising a noise shaper circuit.

Figure 3:
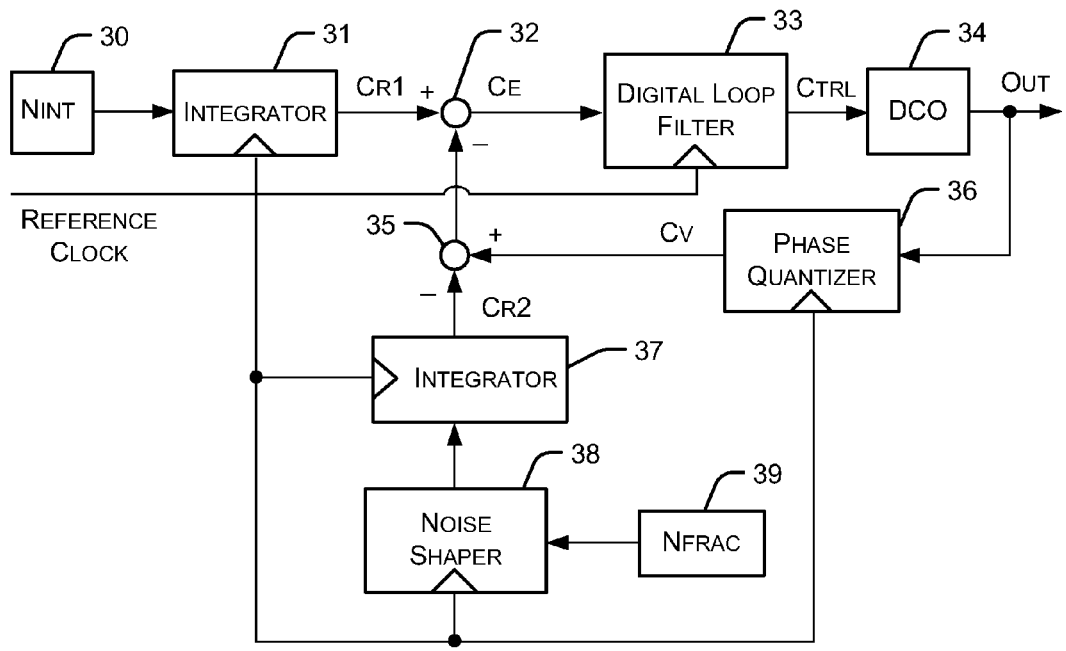
FIG. 3 shows a block diagram of a phase-locked loop according to a further embodiment of the present invention.

In FIG. 3, a block diagram of a phase-locked loop according to a further embodiment of the present invention is shown. The phase-locked loop of the embodiment of FIG. 3 comprises a loop filter 33 which outputs a control signal ctrl based on an error value Ce to control a frequency of an output signal out of DCO 34. Digital loop filter 33 in the embodiment of FIG. 3 is clocked with a reference clock.

Output signal out of DCO 34 is fed to a phase quantizer 36 which is also clocked by the reference clock. Phase quantizer 36 is an example for a feedback value generator and outputs a feedback value Cv which in the embodiment of FIG. 3 is a signal clocked by the reference clock. Phase quantizer 36 may comprise a counter counting rising edges, falling edges or both rising and falling edges of signal out and a sampler like a flip flop sampling the thus counted value based on the reference clock. Phase quantizer 36 may additionally or alternatively comprise a time to digital converter (TDC) which samples the output signal out at a plurality of sampling points within a clock period of the reference clock and outputs a value based on the thus sampled values. Feedback value Cv is in the embodiment of FIG. 3 fed to a positive input of a first subtractor 35.

Furthermore, the phase-locked loop according to the embodiment of FIG. 3 comprises a reference value generator for generating a first reference value Cr1 and a second reference value Cr2. First reference value Cr1 is generated based on an integer Nint of a predetermined value N which is stored in a storage like a memory 30. Second reference value Cr2 is generated based on a fractional part Nfrac of the predetermined value N which is stored in a storage like memory 39. It should be noted that memories 30 and 39 may also be portions of the same memory, wherein the memory may be a rewriteable memory or a read only memory. Instead of a memory, any other type of storage including a hard wiring of the value N within a circuit implementation of the phase-locked loop of FIG. 3 may be used.

The predetermined value N is used to determine a frequency relationship between the output signal out and the reference clock, and N may be an integer or a non-integer value.

Nint is the integer part of N, Nfrac is the fractional part, such that N=Nint+Nfrac, Nint being an integer value and Nfrac being a fractional value between 0 (included) and 1 (excluded).

For generating the first reference value Cr1, in the embodiment of FIG. 3 a first integrator 31 clocked with the reference clock is provided. First integrator 31 integrates the value Nint based on the reference clock. For example, first integrator 31 may comprise a counter which increases the value of Cr1 at every rising edge, every falling edge or every rising and falling edge of the reference clock by Nint.

Furthermore, for generating second reference value Cr2, the value Nfrac is fed to a noise shaper circuit 38 and then integrated in a second integrator 37 which is also clocked by the reference clock. Second integrator 37 may for example be realized as a counter adding the output signal of noise shaper circuit 38 to second reference value Cr2 at every rising edge, every falling edge are both of the reference clock. Noise shaper circuit 38 performs a noise shaping as explained above, i.e. basically outputs a signal which on average has the valued Nfrac, but which is not constant.

Second reference value Cr2 is fed to a negative input of first subtractor 35. An output of first subtractor 35 outputting a value Cv−Cr2 is fed to a negative input of a second subtractor 32, and the first reference value Cr1 is fed to a positive input of second subtractor 32. Second subtractor 32 outputs an error value Ce which corresponds to Cr1−Cv+Cr2 in the embodiment of FIG. 3. First subtractor 35 and second sub-tractor 32 are an example for a combiner combining a feedback value and a reference value which in this case comprises a first reference value and a second reference value.

Figure 4:
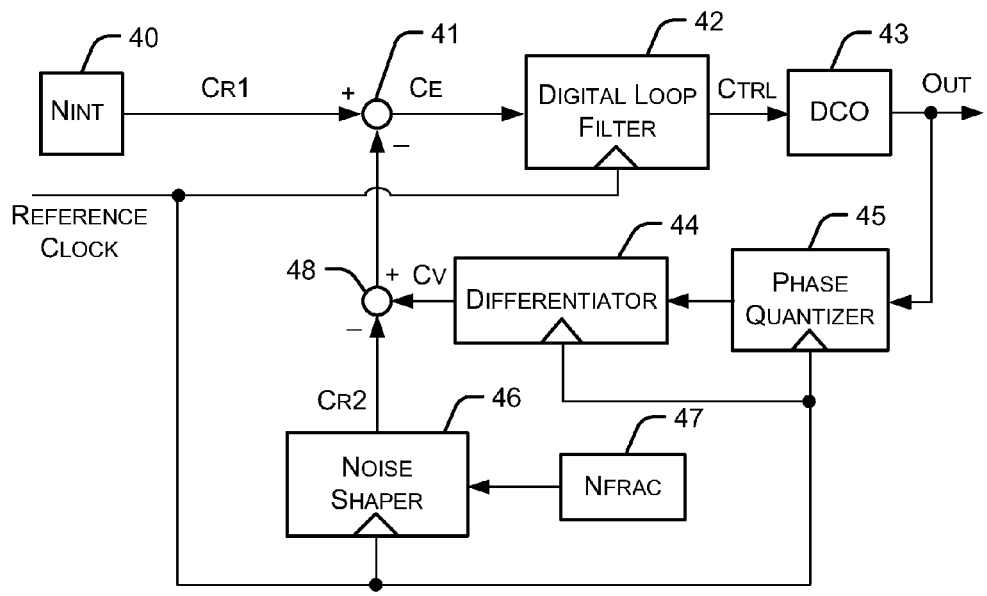
FIG. 4 shows a block diagram of a phase-locked loop according to another embodiment of the present invention.

In FIG. 4, a block diagram of a phase-locked loop according to a further embodiment of the present invention is shown. In the embodiment of FIG. 4, memory 40, first subtractor 48, second subtractor 41, digital loop filter 42, DCO 43, phase quantizer 45, memory 47 and noise shaper 46 correspond to memory 30, first subtractor 35, second subtractor 32, digital loop filter 33, DCO 34, phase quantizer 36, memory 39 and noise shaper 38 of the embodiment of FIG. 3 and will therefore not be described again.

Compared with FIG. 3, first integrator 31 and second integrator 37 have been omitted such that in the embodiment of FIG. 4, the value Nint is directly used as first reference value Cr1 and the output signal of noise shaper 46 is directly used as second reference value Cr2. Between phase quantizer 45 and the positive input of first subtractor 48, a diffentiator 44 which is clocked by the reference clock is provided. Differentiator 44 differentiates the signal output by phase quantizer 45, for example by outputting the difference between the output values of phase quantizer 45 from one period of the reference clock to the next as feedback signal Cv.

Basically, the embodiment of FIG. 3 uses integrated values for feedback and reference values, while the embodiment of FIG. 4 uses differential values.

In the embodiment of FIG. 3, a part of a reference signal, namely the second reference value Cr2, is subjected or generated using noise shaping, similar to the embodiment of FIG. 1 where a noise shaper circuit is incorporated in a reference value generator. In other embodiments, for example the embodiment of FIG. 2, a feedback value is generated using noise shaping. A further embodiment where a feedback value is generated using noise shaping is shown in FIG. 5.

Figure 5:
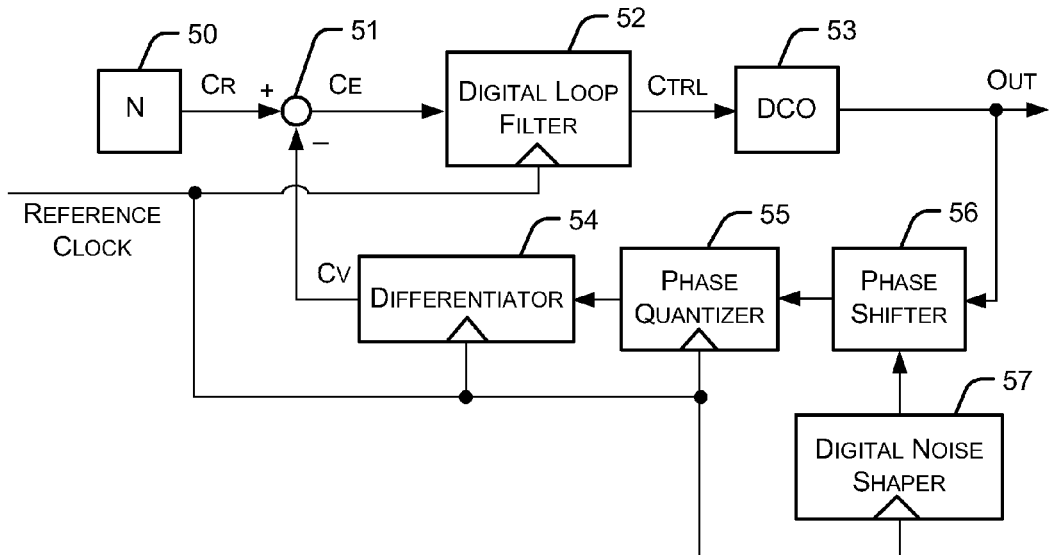
FIG. 5 shows a phase-locked loop according to a further embodiment of the present invention.

In the embodiment of FIG. 5, a reference value Cr fed to a positive input of a subtractor 51 corresponds to a value N stored in a storage like a memory 50. N may be an integer or non-integer value.

A feedback value Cv is fed to a negative input of sub-tractor 51. Subtractor 51 outputs an error value Ce corresponding to Cr−Cv to a digital loop filter 52 which is clocked by a reference clock. Digital loop filter 52 outputs a control signal ctrl to control a digitally controlled oscillator (DCO) 53 which outputs an output signal out having a frequency determined by the control signal ctrl.

To generate the feedback value Cv, the output signal out is fed to a phase shifter 56 controlled by a digital noise shaper circuit 57. Digital noise shaper circuit 57 is clocked by the reference clock. Phase shifter 56 shifts the phase of output signal out depending on a signal received from digital noise shaper 57. In this manner, the phase of a signal output by phase shifter 56 on average corresponds to the phase of signal out, but varies over time in accordance with the signal generated by digital noise shaper circuit 57. Digital noise shaper circuit 57 may for example control phase shifter 56 in an essentially random manner to provide an essentially random phase shifting over time.

The output signal of the phase shifter 56 is fed to a phase quantizer 55 followed by a differentiator 54 which may be implemented as already been described with respect to FIGS. 3 and 4.

While several embodiments of the present invention were described above, the present invention is not limited to these embodiments, and numerous modifications and alterations are possible. For instance, in the embodiments described above, a value N is provided based on which one or more feedback values are generated, the value N determining a frequency relationship between an output signal of a digitally controlled oscillator and a reference clock. In another embodiment, a frequency divider could additionally or alternatively be provided in a feedback path between an output of an oscillator and an input of a combiner like a subtractor or an adder. Moreover, in the embodiments described above, the positive and negative inputs of the subtractors shown may be exchanged when the corresponding digital loop filter and/or the control of the DCO is modified accordingly.

While in the implementation shown in FIGS. 3-5, digital phase-locked loops are shown, in other embodiments some portions of a phase-locked loop may be implemented using analog circuitry.

In the embodiment of FIG. 5, the feedback value Cv and the reference value Cr are "differential values", similar to the embodiment of FIG. 4. In another embodiment, "integral" values may be used, for example by omitting differentiator 54 of FIG. 5 and providing an integrator clocked with the reference clock between memory 50 and the positive input of sub-tractor 51 of FIG. 5.

Figure 6:
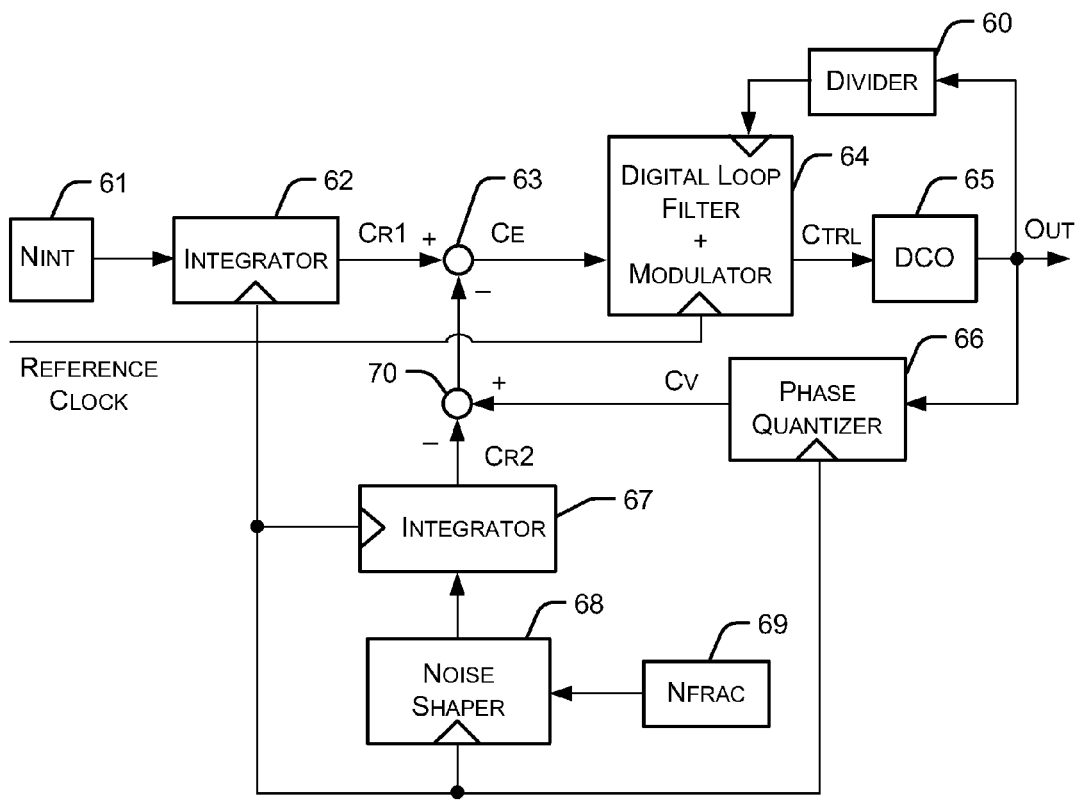
FIG. 6 shows a phase-locked loop according to another embodiment of the present invention.

Moreover, in some embodiments the digital loop filter may comprise a modulator which is controlled based on the output signal. An example for such an embodiment will be discussed with reference to FIG. 6. The embodiment of FIG. 6 is based on the embodiment of FIG. 3, and memory 61, first integrator 62, first subtractor 70, second subtractor 63, DCO 65, phase quantizer 66, memory 69, noise shaper 68 and second integrator 67 correspond to memory 30, first integrator 31, first subtractor 35, second subtractor 32, DCO 34, phase quanitzer 36, memory 39, noise shaper 38 and second integrator 37, respectively.

Compared to the embodiment of FIG. 3, the digital loop filter 33 is replaced with a digital loop filter 64 comprising a modulator to modulate the control signal ctrl based on a feedback signal received from a divider 60. Divider 60 in the embodiment of FIG. 6 is a frequency divider which provides an output signal based on the output signal out and which, compared to the output signal out, has a frequency divided by a dividing factor M which may, but need not be, based on N. Through the modulation, in some embodiments the frequency resolution of the DCO may be improved. It should be noted that this modification, i.e. the provision of a modulator in the digital loop filter controlled via a feedback path comprising a divider, may be applied to any one of the previous-discussed embodiments. It should also be noted that the divider may also be omitted.

In the above embodiments, a single output signal out is used as a basis for generating a feedback value Cv. In other embodiments, an oscillator may be provided which outputs multiple output signals, for example multiple output signals having the same frequency, but different phase offsets. The generation of a feedback value may then be based on two or more of such output signals. An example for an oscillator generating a plurality of output signals is a so-called ring oscillator.

In some of the above embodiments, a value N determining a relationship between the frequency of the output signal out and the reference clock is split in two parts Nint and Nfrac, wherein only Nfrac is subjected to noise shaping. In other embodiments, N may be split in more than two parts, wherein any number of these parts starting from one part and ending with all parts may be subjected to noise-shaping. In other embodiments, when N is an integer number (corresponding to Nfrac=0), a noise shaper may be deactivated.

In the above embodiments, elements like a digital loop filter were directly clocked by the reference clock, i.e. a clock input of such elements is directly coupled with a reference clock input. In other embodiments, the reference clock may be sampled based on an output signal of an oscillator of the phase-locked loop which generates a "retimed" reference clock, i.e. basically a reference clock transferred to the clock domain of the oscillator. Some elements of the phase-locked loop may then be clocked with this retimed reference clock, which corresponds to an indirect coupling of the reference clock input and the respective clock input.

Figure 7:
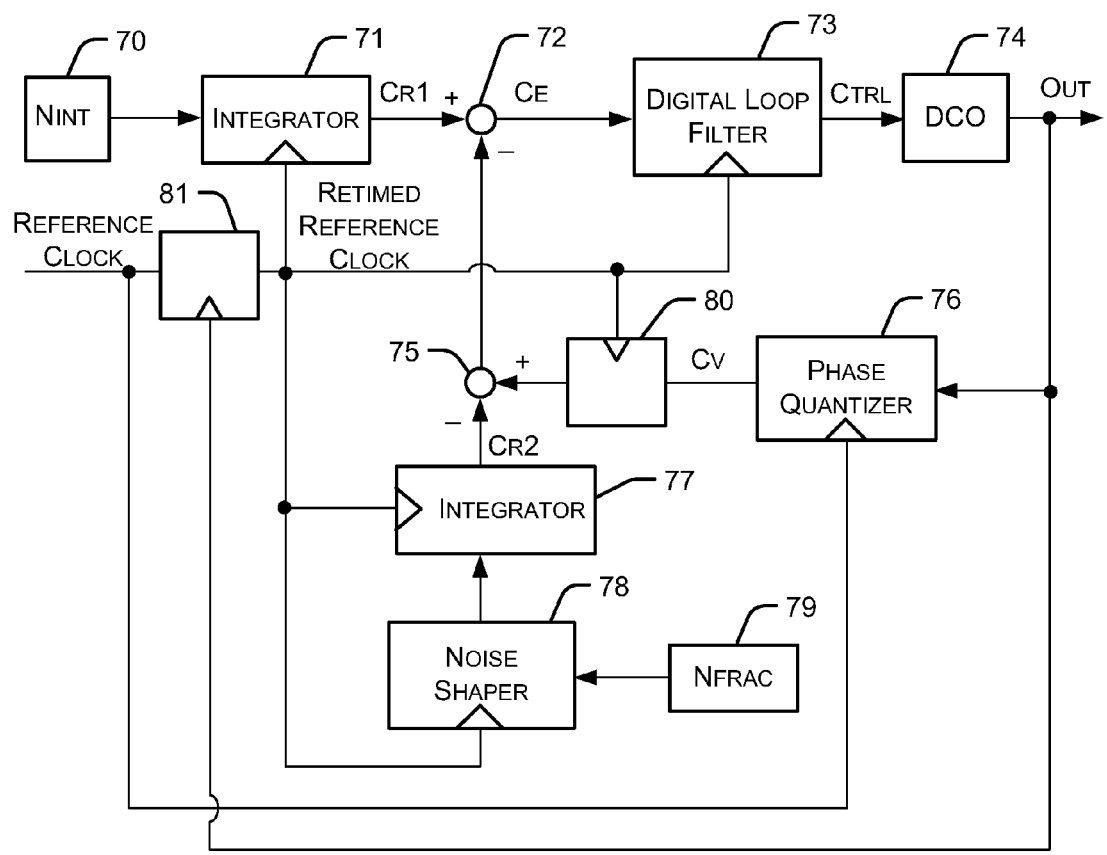
FIG. 7 shows a phase-locked loop according to another embodiment of the present invention.

An example for such an embodiment is shown in FIG. 7. The embodiment of FIG. 7 is based on the embodiment of FIG. 3, and elements 70-79 of the embodiment of FIG. 7 correspond to elements 30-39 of the embodiment of FIG. 3 and will not be described again.

In the embodiment of FIG. 7, the clock input of phase quantizer 76 is directly coupled with a reference clock input, i.e. the reference clock is fed to the clock input of phase quantizer 76. Additionally, the reference clock is fed to an input of a sampling unit 81 which may comprise one or more flipflops and which is configured to sample the reference clock based on the output signal out to generate a retimed reference clock. This retimed reference clock is fed to clock inputs of integrator 71, digital loop filter 73, integrator 77 and noise shaper circuit 78 in the embodiment of FIG. 7.

Additionally, between the positive input of subtractor 75 and the output of phase quantizer 76, a sampling unit 80 is provided which samples feedback value Cv based on the retimed reference clock such that both signals fed to the inputs of subtractor 75 are clocked by the retimed reference clock.

While the embodiment of FIG. 7 has been illustrated as a modification of the embodiment of FIG. 3, also in other embodiments, for example based on the embodiments of FIGS. 4, 5 and 6, some elements may be clocked by a retimed reference clock instead of being clocked directly by the reference clock or, in other words, the clock inputs of such elements may be coupled indirectly with the reference clock input with an intervening sampling unit sampling the reference clock based on an output signal of the osciallator of the respective phase-locked loop.

As can be seen, numerous modifications and alterations are possible. Therefore, the present invention is not to be limited by the previously-described embodiments, but is intended to be limited only by the appended claims and equivalents thereof.

What is claimed is:

1. A circuit, comprising:
an oscillator configured to generate an output signal, said output signal having a frequency;
a feedback value generator coupled to said oscillator, said feedback value generator comprising a noise shaper circuit and being configured to generate a feedback value depending on said output signal, the feedback value being noise shaped, wherein said feedback value generator comprises:
 a phase shifter circuit configured to shift a phase of said output signal controlled by said noise shaper circuit and to output a phase shifted output signal, and
 a phase quantizer configured to receive said phase shifted output signal;
a reference value generator configured to generate a reference value depending on a predetermined value;
a combiner configured to combine said reference value and said feedback value, and to output a combined value; and
a loop filter configured to generate a control signal to control said oscillator depending on said combined signal.

2. The circuit of claim 1,
wherein said oscillator is a digitally controlled oscillator.

3. The circuit of claim 1, wherein said feedback value generator further comprises a differentiator coupled between said phase quantizer and said combiner.

4. The circuit of claim 1,
wherein said loop filter comprises a modulator configured to modulate said control signal based on said output signal.

5. A circuit, comprising:
an oscillator comprising a control input and an output,
a reference clock input,
a phase quantizer comprising an input, an output and a clock input, said input of said phase quantizer being coupled with said output of said oscillator and said clock input of said phase quantizer being coupled with said reference clock input,
a first storage and a second storage,
a noise shaper circuit comprising an input, an output and a clock input, said input of said noise shaper being coupled with said second storage, and
a combiner comprising a first input, a second input, a third input and an output, a first input of said combiner being coupled with said first storage, a second input of said combiner being coupled with said output of said noise shaper and a third input of said combiner being coupled with said output of said phase quantizer, and
a loop filter comprising an input, an output and a clock input, said clock input of said loop filter being coupled with said reference clock, said output of said loop filter being coupled with said control input of said oscillator and said input of said loop filter being coupled with said output of said combiner.

6. The circuit of claim 5,
wherein said combiner comprises at least one subtractor.

7. The circuit of claim 5,
wherein said first storage stores an integer value and said second storage stores a value selected from the interval from 0 and 1, including 0.

8. The circuit of claim 5, further comprising a first integrator coupled between said first storage and said first input of said combiner and a second integrator coupled between said output of said noise shaper and said second input of said combiner.

9. The circuit of claim 5, further comprising a differentiator coupled between said output of said phase quantizer and said third input of said combiner.

10. The circuit of claim 5,
further comprising a sampling circuit comprising an input, a clock input and an output, wherein said clock input of said sampling circuit is coupled with said output of said oscillator, wherein said input of said sampling circuit is coupled with said reference clock input and wherein said output of said sampling circuit is coupled with at least one clock input selected from the group comprising said clock input of said noise shaper circuit and said clock input of said loop filter.

11. A circuit, comprising:
an oscillator comprising an output and a control input,
a phase shifter circuit comprising an input, an output and a control input, said input of said phase shifter circuit being coupled with said output of said oscillator, a noise shaper circuit comprising an output and a clock input, said output of said noise shaper circuit being coupled with said control input of said phase shifter circuit and said clock input of said noise shaper circuit being coupled with a reference clock input, a phase quantizer comprising an input and an output, said input of said phase quantizer being coupled with said output of said phase shifter, a storage comprising an output, a combiner comprising a first input, a second input and an output, said first input of said combiner being coupled with said output of said storage and said second input of said combiner being coupled with said output of said phase quantizer, and a loop filter comprising an input and an output, said input of said loop filter being coupled with said output of said combiner and said output of said loop filter being coupled with said control input of said oscillator.

12. The circuit of claim 11,
wherein said combiner comprises at least one subtractor.

13. The circuit of claim 11,
wherein said loop filter comprises a clock input coupled with said reference clock input and wherein said phase quantizer comprises a clock input coupled with said reference clock input.

14. The circuit of claim 11, further comprising a differentiator coupled between said output of said phase quantizer and said second input of said combiner.

15. The circuit of claim 11, further comprising an integrator coupled between said output of said storage and said input of said combiner.

* * * * *